(12) United States Patent
Kim

(10) Patent No.: US 7,670,863 B2
(45) Date of Patent: *Mar. 2, 2010

(54) METHOD OF FABRICATING COMPLEMENTARY METAL OXIDE SILICON IMAGE SENSOR

(75) Inventor: Jin Han Kim, Icheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 34 days.

This patent is subject to a terminal disclaimer.

(21) Appl. No.: 11/646,805

(22) Filed: Dec. 27, 2006

(65) Prior Publication Data

US 2007/0148806 A1 Jun. 28, 2007

(30) Foreign Application Priority Data

Dec. 28, 2005 (KR) .................. 10-2005-0131423

(51) Int. Cl.
*H01L 21/00* (2006.01)
(52) U.S. Cl. .................. 438/57; 257/E31.121; 438/70
(58) Field of Classification Search ............ 438/47–48, 438/59–60, 66, 70–71, 75, 725, 737, 738, 438/57, 26, 28, 29, 72; 257/292–293, 432, 257/E31.127, E21.001, E21.252, E21.249, 257/E21.576, E21.244, E23.132, 89, 290, 257/291, 294, E27.133, E31.121, E33.073
See application file for complete search history.

(56) References Cited

U.S. PATENT DOCUMENTS 5,451,293 A * 9/1995 Tabara .................. 438/669
5,483,096 A * 1/1996 Kuhara .................. 257/462

(Continued)

FOREIGN PATENT DOCUMENTS

KR 10-2005-0011951 A 1/2005

(Continued)

OTHER PUBLICATIONS

Joon Hwang; "Method of Manufacturing Image Sensor Using Barrier Layer for Restraining Generation of Metal Pad Particles"; Korean Patent Publication No. 100504563 B1; Publication Date: Jul. 21, 2005; Korean Intellectual Property Office; Republic of Korea.

(Continued)

*Primary Examiner*—Ha Tran T Nguyen
*Assistant Examiner*—Shaun Campbell
(74) *Attorney, Agent, or Firm*—The Law Offices of Andrew D. Fortney; Andrew D. Fortney

(57) ABSTRACT

Provided is a method of fabricating a complementary metal oxide silicon image sensor. The method includes: applying a passivation oxide and a passivation nitride after forming a pad; selectively removing the passivation nitride in a pad region and a pixel region by a photolithography process, and performing a first cleaning process; performing a hydrogen anneal process; opening the pad by removing the passivation oxide in the pad region and performing a second cleaning process; applying a pad protective layer; performing a color filter array process, a planarization process, and a microlens process after the applying of the pad protective layer; and removing the pad protective layer in the pad region.

19 Claims, 6 Drawing Sheets

U.S. PATENT DOCUMENTS

| | | | | |
|---|---|---|---|---|
| 6,107,191 | A | * | 8/2000 | Han .......................... 438/637 |
| 6,127,715 | A | * | 10/2000 | Yamamoto et al. .......... 257/459 |
| 6,188,092 | B1 | | 2/2001 | Hatano et al. |
| 6,369,417 | B1 | | 4/2002 | Lee |
| 6,794,215 | B2 | * | 9/2004 | Park et al. ..................... 438/69 |
| 6,803,250 | B1 | * | 10/2004 | Yaung et al. .................. 438/70 |
| 7,193,289 | B2 | | 3/2007 | Adkisson et al. |
| 7,268,009 | B2 | | 9/2007 | Hwang |
| 2006/0046341 | A1 | | 3/2006 | Joon |
| 2006/0183265 | A1 | * | 8/2006 | Oh et al. ....................... 438/65 |

FOREIGN PATENT DOCUMENTS

| | | | |
|---|---|---|---|
| KR | 10-2005-0011955 A | | 1/2005 |
| KR | 10-0504563 B1 | | 7/2005 |
| KR | 10-2005-0079495 | * | 8/2005 |
| TW | 525223 | | 3/2003 |
| TW | 525223 B | | 3/2003 |

OTHER PUBLICATIONS

Eun Mi Huh; "Method for Manufacturing CMOS Image Sensor Capable of Protecting Lifting of Microlens Capping Layer"; Korean Patent Publication No. 1020050011955 A; Publication Date: Jan. 31, 2005; Korean Intellectual Property Office; Republic of Korea.

Sung-Shiung Wang and Jian-Luen Yang; "Method for Removing Photoresist and Residual Polymer from Polysilicon Gate"; Taiwan Patent Publication No. TW525223B; Publication Date: Mar. 21, 2003; esp@cenet database—Worldwide.

Office Action (at least in part) date-stamped Nov. 14, 2008; Chinese Patent Application No. 2006-101701945; State Intellectual Property Office, People's Republic of China; Beijing, P.R.C.

Joon Hwang; "Method of Manufacturing Image Sensor Using Barrier Layer for Restraining Generation of Metal Pad Particles"; Korean Patent Abstracts; Publication No. 100504563 B1; Publication Date: Jul. 21, 2005; Korean Intellectual Property Office, Republic of Korea.

Eun Mi Huh; "Method for Manufacturing CMOS Image Sensor Capable of Protecting Lifting of Microlens Capping Layer"; Korean Patent Abstracts; Publication No. 1020050011955 A; Publication Date: Jan. 31, 2005; Korean Intellectual Property Office, Republic of Korea.

Eun Mi Huh; "Method for Manufacturing CMOS Image Sensor Capable of Protecting Lifting of Microlens Capping Layer"; Korean Patent Abstracts; Publication No. 1020050011951 A; Publication Date: Jan. 31, 2005; Korean Intellectual Property Office, Republic of Korea.

Sung-Shiung Wang and Jian-Luen Yang; "Method for Removing Photoresist and Residual Polymer from Polysilicon Gate"; esp@cenet; Taiwanese Publication No. TW525223 B; Publication Date: Mar. 21, 2003; esp@cenet Database—Worldwide, http://v3.espacenet.com/publicationDetails/biblio?KC=B&date=. . . .

* cited by examiner

METHOD OF FABRICATING COMPLEMENTARY METAL OXIDE SILICON IMAGE SENSOR

BACKGROUND OF THE INVENTION

1. Field of the Invention

The present invention relates to a method of fabricating a semiconductor device, and more particularly, to a method of fabricating a complementary metal oxide silicon (CMOS) image sensor. The present invention relates to especially to a process after forming a pad from a metal line layer.

2. Description of the Related Art

Characteristics of a CMOS image sensor depend on sensitivity of a photo diode receiving external light particles. This sensitivity is mainly determined by a distance between a microlens and a photo diode, and also a thin film characteristic. Unlike a metal layer that completely reflects all light, a passivation nitride of a related art pixel block generally screens and reflects a relatively large portion of light compared to a passivation oxide. Accordingly, the sensitivity of a CMOS image sensor deteriorates.

On the other hand, a hydrogen anneal process, e.g., a sintering process in the presence of hydrogen or other reducing gas or gas mixture, is performed to improve characteristics of low illumination in a related art CMOS image sensor. Since a passivation nitride is applied thickly, it has a tendency to block hydrogen ions, thereby deteriorating process effectiveness.

Additionally, unlike a related art semiconductor manufacturing process, the hydrogen anneal process for a CMOS image sensor is performed after stacking the passivation nitride not after stacking the passivation oxide.

Disadvantages of a method of fabricating a related art CMOS image sensor are described with reference to FIGS. 1A through 1H. Especially, FIGS. 1A through 1H illustrate processes from forming a pad to fabricate a microlens until opening a pad.

Referring to FIG. 1A, after forming a pad 110, a passivation oxide 120 and passivation nitride 130 are formed. On the other hand, unlike an actual main chip region inside a wafer, an irregular wafer edge remaining layer 100 remains in an edge region of the wafer due to a wafer edge going through various photolithography processes. Because of the irregular wafer edge remaining layer 100, the adhesive strength weakens in an edge region of the wafer.

As illustrated in FIG. 1B, a hydrogen process is performed in a case of a CMOS image sensor. The hydrogen process is a thermal treatment process using gas that includes an appropriate ratio of nitrogen and oxygen gas. A wafer edge peeling 140 occurs during this thermal treatment process. In the wafer edge peeling 140, the passivation nitride 130 remaining in the wafer edge comes off in a circle form due to the deepening of an interlayer stress in the passivation nitride 130 or the rising of fluorine ion in a fluorinated silicate glass of the wafer edge remaining layer 100. Moreover, during the thermal treatment process, defect peeled from the wafer edge pops into a pixel region in an inner part of the wafer. A particle moved into the inner part of the wafer is called a circle defect 145.

Referring to FIG. 1C, scrubbing is performed to remove these circle defects 145, and the region of a pad 100 is opened through a photolithography process. Next, a cleaning and pad processing process including a pad ashing process, a solvent cleaning process, and a final cure process is performed. Although the scrubbing is performed to remove the circle defects 145, the circle defect 145 still remains.

Referring to FIG. 1D, a pad protective layer 150 is applied. The pad protective layer 150 may be a plasma enhanced tetra ethyl ortho silicate (PE-TEOS) layer or a thermosetting resin layer. The pad protective layer 150 has a thickness of 200 to 500 Å by a thin application, thereby making it easy for opening the pad 110 later.

FIG. 1E is a sectional view of a color filter array 160 by a color photolithography process. FIG. 1F is a sectional view of a planarization layer 170 by a planarization layer photolithography process. FIG. 1G is a sectional view of a convex microlens 180 by thermal reflow in a microlens process. Finally, FIG. 1H is a sectional view of opening the pad 110 by etching the pad protective layer 150 in a pad region. Next, it is possible to perform a probing test.

SUMMARY OF THE INVENTION

Accordingly, the present invention is directed to a method of fabricating a CMOS image sensor that substantially obviates one or more problems due to limitations and disadvantages of the related art.

An object of the present invention is to provide a method of fabricating a CMOS image sensor that drastically enhances sensitivity by removing a passivation nitride in a pixel region of a CMOS image sensor, improving a low illumination characteristic by increasing effectiveness of a hydrogen anneal, and improving quality and yield of the image sensor by removing circle defect that occurs in a wafer edge region and then moves into a pixel region.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure(s) particularly pointed out in the written description and claims hereof as well as the appended drawings.

To achieve these objects and other advantages and in accordance with the purpose of the invention, as embodied and broadly described herein, there is provided a method of fabricating a complementary metal oxide silicon image sensor, the method including: applying a passivation oxide and a passivation nitride after forming a pad; selectively removing the passivation nitride in a pad region and a pixel region by a photolithography process, and performing a first cleaning process; performing a hydrogen anneal process; opening the pad by removing the passivation oxide in the pad region and performing a second cleaning process; applying a pad protective layer; performing a color filter array process, a planarization process, and a microlens process after the applying of the pad protective layer; and removing the pad protective layer in the pad region.

The performing of the first cleaning process may include performing an ashing process and a solvent cleaning process. The performing of the second cleaning process may include performing a first ashing process, a solvent cleaning process, and a second ashing process. The pad protective layer may be one of a PE-TEOS layer and a thermosetting resin layer. The pad protective layer may have a thickness of 200 to 600 Å. The PE-TEOS layer is removed by dry etch. The thermosetting resin layer may be removed by oxygen ashing. The pad region opened by removing the passivation oxide may be broader than the pad region opened by removing the passivation nitride.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 2A through 2I are sectional views illustrating a method of fabricating a CMOS image sensor according to an embodiment of the present invention. FIGS. 2A through 2D are sectional views of processes after forming a pad 210.

Figure 1A:
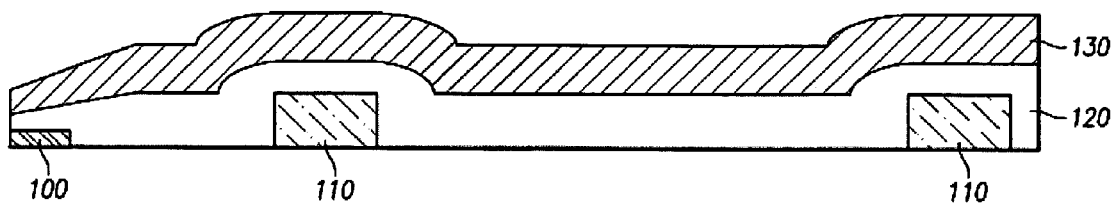
FIGS. 1A through 1H are sectional views illustrating a related art method of fabricating a CMOS image sensor.
Figure 1B:
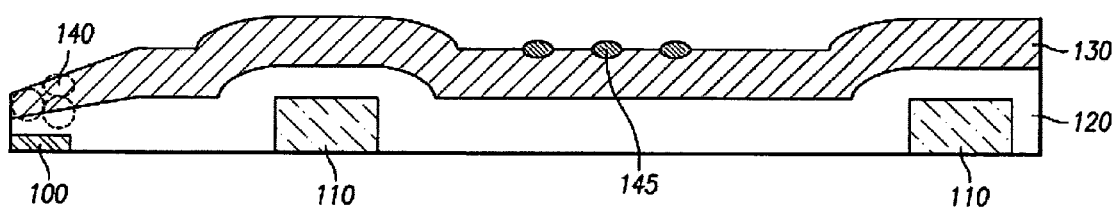
Figure 1C:
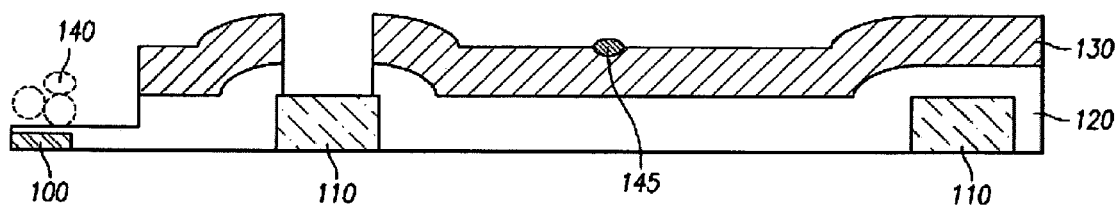
Figure 1D:
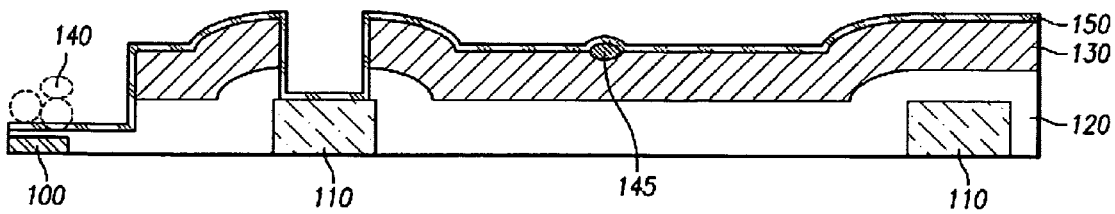
Figure 1E:
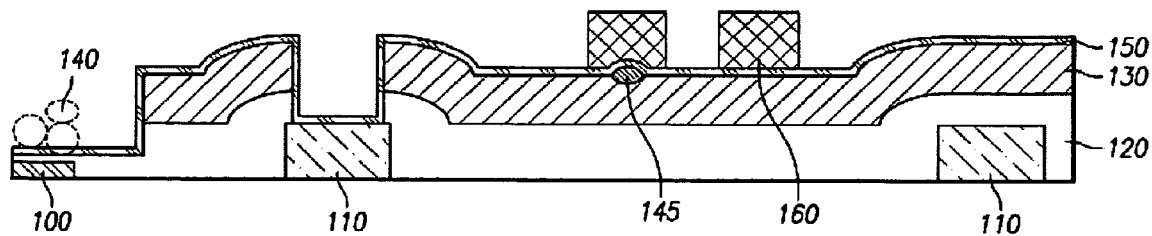
Figure 1F:
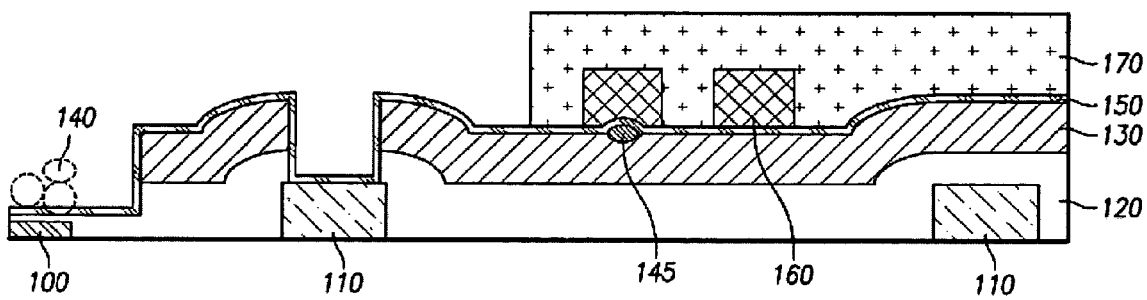
Figure 1G:
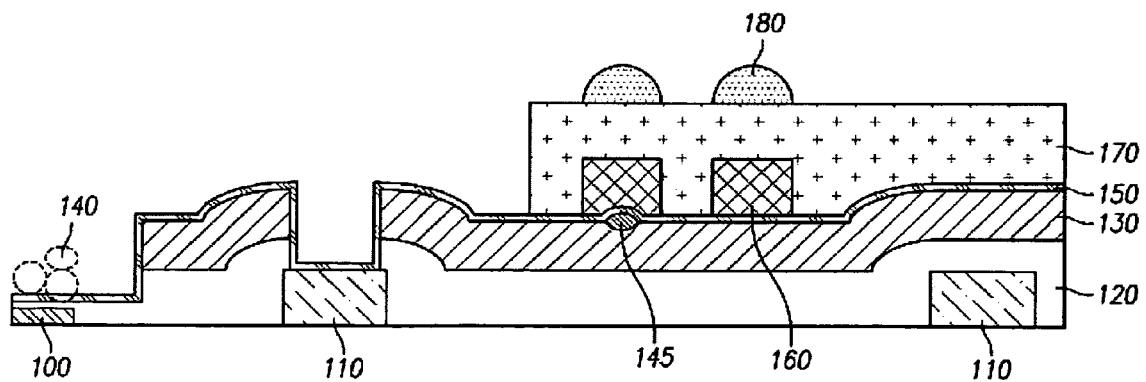
Figure 1H:
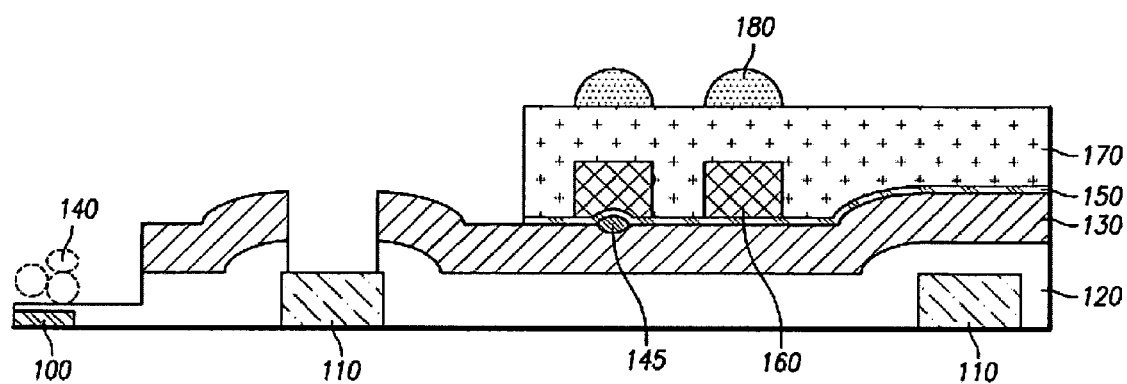
Figure 2A:
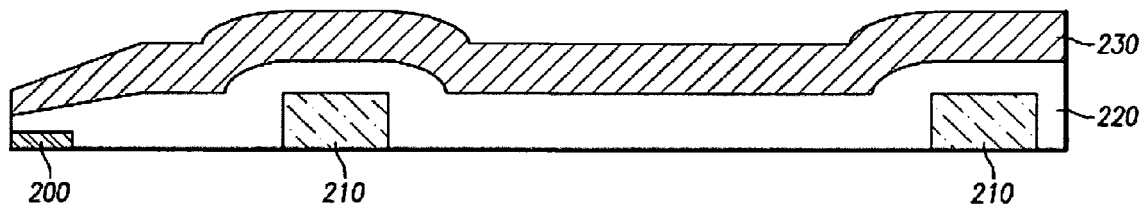
FIGS. 2A through 2I are sectional views illustrating a method of fabricating a CMOS image sensor according to an embodiment of the present invention.

Referring to FIG. 2A, after forming a pad 210, a passivation oxide 220 and a passivation nitride 230 are sequentially-applied. After applying the passivation oxide 220, a chemical mechanical planarization process is performed and then the passivation nitride 230 is applied. On the other hand, unlike an actual main chip region inside a wafer, an irregular wafer edge remaining layer 200 remains in an edge region of the wafer due to a wafer edge going through various photolithography processes. Because of the irregular wafer edge remaining layer 200, the adhesive strength weakens in an edge region of the wafer.

Figure 2B:
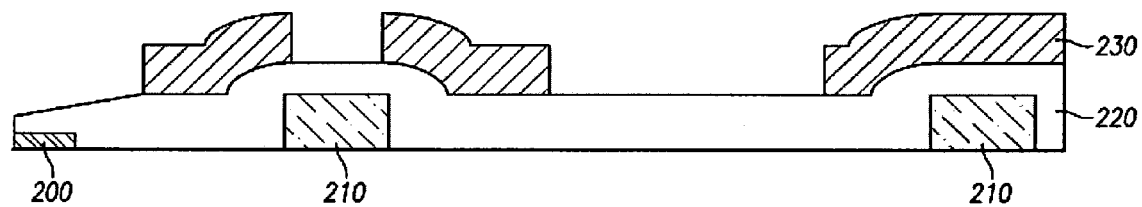
Figure 2C:
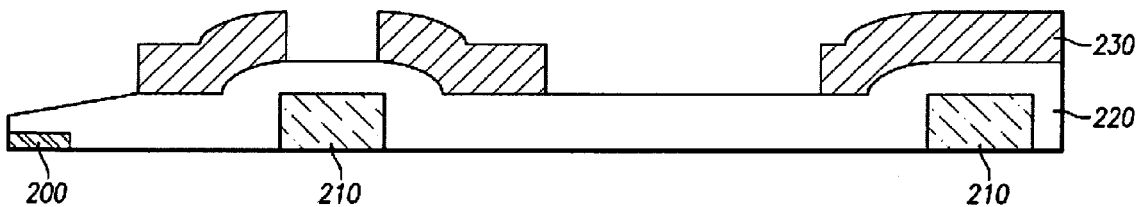

FIG. 2B is a sectional view of when only the passivation nitride 230 in a pad region and a pixel region is removed by a photolithography process. FIG. 2C is a section view of when a thermal treatment process using gas that includes an appropriate ratio of nitrogen and oxygen, i.e., a hydrogen anneal process, is performed. The passivation nitride 230 in an image signal processor (ISP) logic block of a main chip region of a wafer is not etched, but only the passivation nitride 230 in the pixel region is removed. Accordingly, since the passivation nitride 230 has a relatively large reflexibility for light particle compared to the passivation oxide 220, the sensitivity of a CMOS image sensor increases. Moreover, since the passivation nitride 230 in the pad and pixel regions is removed, hydrogen ions more effectively fill the damaged dangling bond of a silicon surface during the hydrogen anneal process. Accordingly, since a dark signal caused by free electrons that occur in the damaged dangling bond is prevented, a low illumination characteristic can improve. On the other hand, when a cleaning process is performed after this etching process, only ashing and solvent cleanings are performed.

Figure 2D:
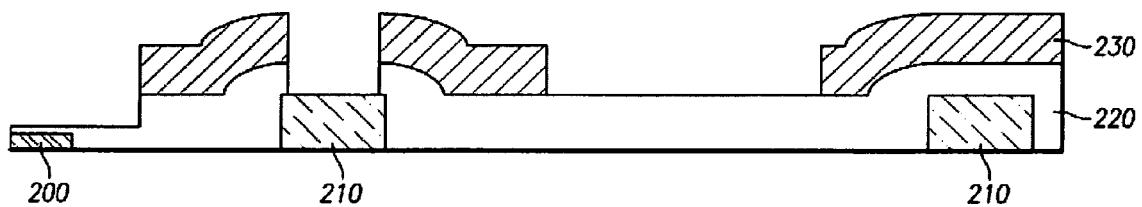

FIG. 2D is a sectional view of when the passivation oxide 220 in the pad region is etched by a photolithography process. A region of the opened pad 210 is more widely etched than a region of the opened pad 210 of FIG. 2B. This is for an alignment error during a next photolithography process. A second cleaning process including a first ashing, solvent cleaning, and second ashing is subsequently performed. Unlike the first cleaning process of FIG. 2O, since the pad 210 is opened, by performing one more ashing (a second ashing), the pad 210 becomes cleaner and a pad corrosion is prevented.

Figure 2E:
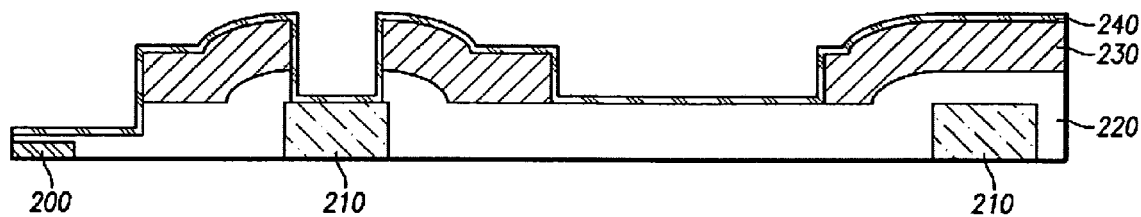

Next, as illustrated in FIG. 2E, a pad protective layer 240 is formed on an entire substrate. The pad protective layer 240 may be a PE-TEOS layer or a thermosetting resin layer. The pad protective layer 240 has a thickness of 200 to 600 Å thereby making it easy for removing the pad protective layer 240 in the pad region after a microlens process.

Figure 2F:
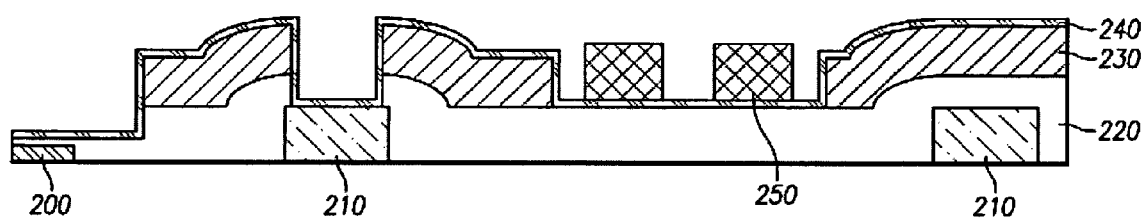
Figure 2G:
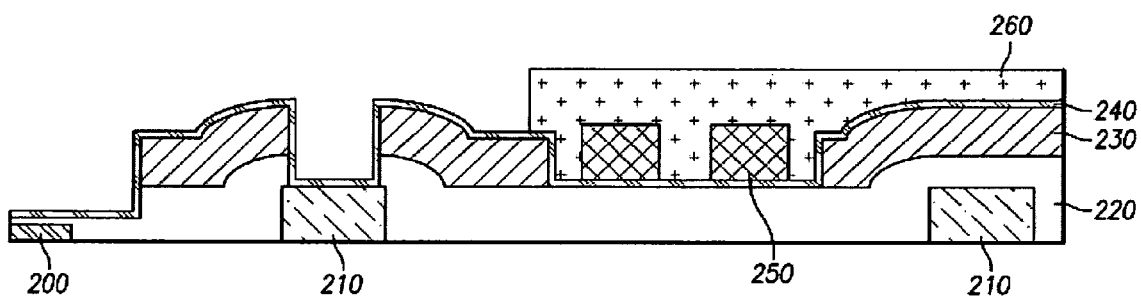
Figure 2H:
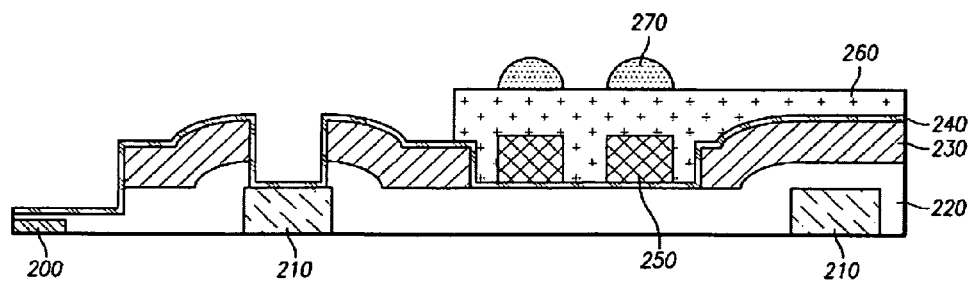
Figure 2I:
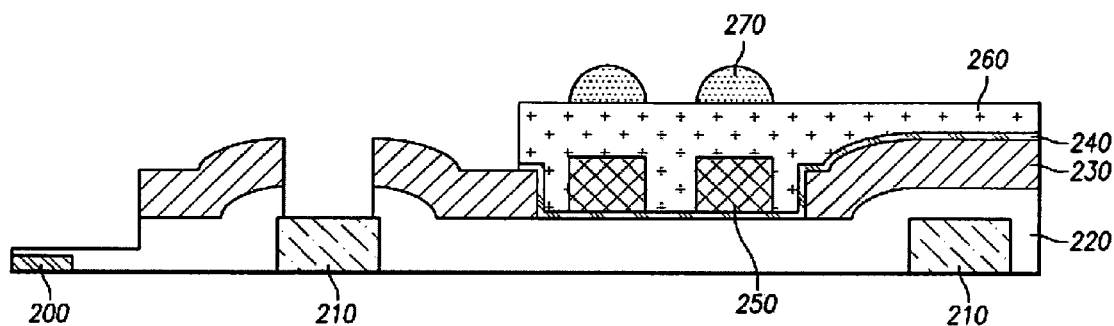

Next, a color filter array 250 is formed in a pixel region by a color photolithography process in FIG. 2F. Additionally, a planarization layer 260 is formed by a photolithography process in FIG. 2G, and then a convex microlens 270 is formed by a thermal process in FIG. 2H. Finally, a pad protective layer 240 is removed to open pad 210. At this point, when the pad protective layer 240 is a PE-TEOS layer, it is removed using dry etch, and when the pad protective layer 240 is a thermosetting resin layer, it is removed by oxygen ashing.

According to the present invention, the present invention is to provide a method of fabricating a CMOS image sensor that drastically enhances sensitivity by etching a passivation nitride in a pad region and a pixel region to reduce reflexibility for light, and preventing the peeling of a wafer edge region or a circle defect in a pixel region by performing a hydrogen anneal process after removing a passivation nitride. Moreover, since an hydrogen anneal process is performed after removing a passivation nitride in a pixel region and a pad region, a hydrogen anneal effect, which allows a large amount of hydrogen ions to reach the damaged dangling bond of a silicon surface, can be maximized to enhance a low illumination characteristic of a CMOS image sensor.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a complementary metal oxide silicon (CMOS) image sensor, comprising:

forming a passivation oxide and a passivation nitride on the CMOS image sensor having a pad in a pad region thereof;

selectively removing the passivation nitride in the pad region and in a pixel region by a photolithography process to form a groove in the pixel region, and performing a first cleaning process;

performing a hydrogen anneal process;

opening the pad by removing the passivation oxide in the pad region and performing a second cleaning process;

forming a pad protective layer on the pad, the passivation nitride, and the passivation oxide, after selectively removing the passivation nitride and opening the pad, wherein the pad protective layer directly contacts the passivation oxide in the pixel region;

forming a color filter array directly on the pad protective layer in the groove in the pixel region, then forming a planarization layer and a microlens thereafter; and removing the pad protective layer in the pad region.

2. The method according to claim 1, wherein the first cleaning process comprises an ashing process and a solvent cleaning process.

3. The method according to claim 1, wherein the second cleaning process comprises a first ashing process, a solvent cleaning process, and a second ashing process.

4. The method according to claim 1, wherein the pad protective layer comprises one of a plasma enhanced tetraethyl orthosilicate (PE-TEOS) layer and a thermosetting resin layer.

5. The method according to claim 1, wherein the pad protective layer has a thickness of 200 to 600 Å.

6. The method according to claim 4, wherein the pad protective layer comprises the PE-TEOS layer, and removing the PE-TEOS layer comprises dry etching.

7. The method according to claim 4, wherein the pad protective layer comprises the thermosetting resin layer, and removing the thermosetting resin layer comprises oxygen ashing.

8. A method of fabricating a complementary metal oxide silicon (CMOS) image sensor, comprising:
   forming an oxide layer on the CMOS image sensor, including in a pad region, a pixel region, and a signal processor region of the image sensor;
   forming a passivation nitride on the oxide layer;
   selectively removing the passivation nitride in the pad region and the pixel region to form a groove in the pixel region;
   performing a hydrogen anneal process after selectively removing the passivation nitride;
   opening a pad by removing the oxide layer in the pad region;
   forming a pad protective layer on the pad, the passivation nitride, and the passivation oxide, after selectively removing the passivation nitride and opening the pad, wherein the pad protective layer directly contacts the passivation oxide in the pixel region;
   forming a color filter array directly on the pad protective layer in the groove in the pixel region, then forming a planarization layer and a microlens in the pixel region; and
   removing the pad protective layer in the pad region.

9. The method according to claim 8, further comprising a first cleaning process after selectively removing the passivation nitride.

10. The method according to claim 9, wherein the first cleaning process comprises an ashing process and a solvent cleaning process.

11. The method according to claim 8, further comprising a second cleaning process after removing the oxide layer in the pad region.

12. The method according to claim 11, wherein the second cleaning process comprises a first ashing process, a solvent cleaning process, and a second ashing process.

13. The method according to claim 8, wherein the pad protective layer comprises one of a plasma enhanced tetraethyl orthosilicate (PE-TEOS) layer and a thermosetting resin layer.

14. The method according to claim 8, wherein the pad protective layer has a thickness of 200 to 600 Å.

15. The method according to claim 13, wherein the pad protective layer comprises the PE-TEOS layer, and removing the PE-TEOS layer comprises dry etching.

16. The method according to claim 13, wherein the pad protective layer comprises the thermosetting resin layer, and removing the thermosetting resin layer comprises oxygen ashing.

17. The method according to claim 8, wherein the pad protective layer is also formed in the pixel region.

18. The method according to claim 8, wherein the pad has a width greater than a corresponding opening in the oxide layer and nitride layer in the pad region.

19. The method according to claim 8, wherein at least a portion of the color filter is formed on the same horizontal plane with the passivation nitride.

* * * * *